United States Patent
Humphrey et al.

(10) Patent No.: US 11,165,242 B2
(45) Date of Patent: Nov. 2, 2021

(54) VARIABLE SOFT START DEVICE FOR AN ELECTRONIC FUSE

(71) Applicant: HEWLETT PACKARD ENTERPRISE DEVELOPMENT LP, Houston, TX (US)

(72) Inventors: Daniel Humphrey, Houston, TX (US); Howard Leverenz, Houston, TX (US); Michael Delany, Houston, TX (US); Mohamed Amin Bemat, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 614 days.

(21) Appl. No.: 16/063,363

(22) PCT Filed: Dec. 18, 2015

(86) PCT No.: PCT/US2015/066626
§ 371 (c)(1),
(2) Date: Jun. 18, 2018

(87) PCT Pub. No.: WO2017/105482
PCT Pub. Date: Jun. 22, 2017

(65) Prior Publication Data
US 2019/0006839 A1 Jan. 3, 2019

(51) Int. Cl.
*H02H 9/00* (2006.01)
*G06F 1/26* (2006.01)
(Continued)

(52) U.S. Cl.
CPC ......... *H02H 9/001* (2013.01); *G01R 27/2605* (2013.01); *G06F 1/26* (2013.01);
(Continued)

(58) Field of Classification Search
CPC .. H02H 9/001; H03K 17/0822; H03K 17/163; H03K 17/223; G06F 1/26; G01R 27/2605
See application file for complete search history.

(56) References Cited

U.S. PATENT DOCUMENTS

| 6,094,017 A | 7/2000 | Adamson |
| 7,324,316 B2 | 1/2008 | Chen et al. |

(Continued)

FOREIGN PATENT DOCUMENTS

WO   WO-2014001945 A2   1/2014

OTHER PUBLICATIONS

STMicroelectronics, "STEF 12 Electronic Fuse for 12 V Line", Datasheet—production data, DocID019056 Rev 6, Aug. 2015, 20 pages.

(Continued)

*Primary Examiner* — Thienvu V Tran
*Assistant Examiner* — Shahzeb K Ahmad
(74) *Attorney, Agent, or Firm* — Hewlett Packard Enterprise Patent Department

(57) ABSTRACT

Example implementations relate to a variable soft start device. For example, in an implementation, the variable soft start device may set the capacitance of a variable capacitance circuit connected to a soft start pin of the electronic fuse. The variable soft start device may read a power-good signal from the electronic fuse and determine the capacitance to set according to the power-good signal.

20 Claims, 6 Drawing Sheets

(51) Int. Cl.
    *H03K 17/16* (2006.01)
    *H03K 17/22* (2006.01)
    *H03K 17/082* (2006.01)
    *G01R 27/26* (2006.01)
(52) U.S. Cl.
    CPC ....... *H03K 17/0822* (2013.01); *H03K 17/163* (2013.01); *H03K 17/223* (2013.01)

(56) References Cited

U.S. PATENT DOCUMENTS

| | | | |
|---|---|---|---|
| 8,194,379 | B2 | 6/2012 | Herr et al. |
| 8,310,098 | B2* | 11/2012 | Kumar .................... H02M 3/06 |
| | | | 307/66 |
| 8,917,064 | B2* | 12/2014 | Schlak ................... H02H 9/002 |
| | | | 320/162 |
| 9,013,169 | B2 | 4/2015 | Fu et al. |
| 2003/0076079 | A1 | 4/2003 | Alcantar et al. |
| 2008/0266738 | A1 | 10/2008 | Kimber |
| 2011/0085274 | A1 | 4/2011 | Jarman |
| 2014/0285935 | A1* | 9/2014 | Tsai ....................... H02H 3/087 |
| | | | 361/86 |
| 2014/0375294 | A1* | 12/2014 | Lv .......................... H02H 9/002 |
| | | | 323/299 |
| 2015/0108836 | A1 | 4/2015 | Hsu et al. |
| 2015/0214826 | A1* | 7/2015 | Wahby ................... H02M 1/08 |
| | | | 363/21.01 |
| 2017/0346483 | A1* | 11/2017 | Hokazono ............ H03K 17/163 |

OTHER PUBLICATIONS

International Search Report and Written Opinion, International Application No. PCT/US2015/066626, dated Sep. 5, 2016, pp. 1-12, KIPO.

Texas Instruments Incorporated, "Power Supply with Programmable Output Voltage and Protection for Position Encoder Interfaces," Sep. 2014, pp. 1-56, USA.

* cited by examiner

VARIABLE SOFT START DEVICE FOR AN ELECTRONIC FUSE

BACKGROUND

A computing device such as a server may be configured with various components. Examples of such components include expansion cards (e.g., PCI cards), storage devices (e.g., hard disk drives), memory, and others. Different components may exhibit different electrical characteristics. An electronic fuse may be connected to the power supply of the computing device to limit inrush current to the components.

BRIEF DESCRIPTION OF THE DRAWINGS

Various examples will be described below with reference to the following figures.

Figure 1:
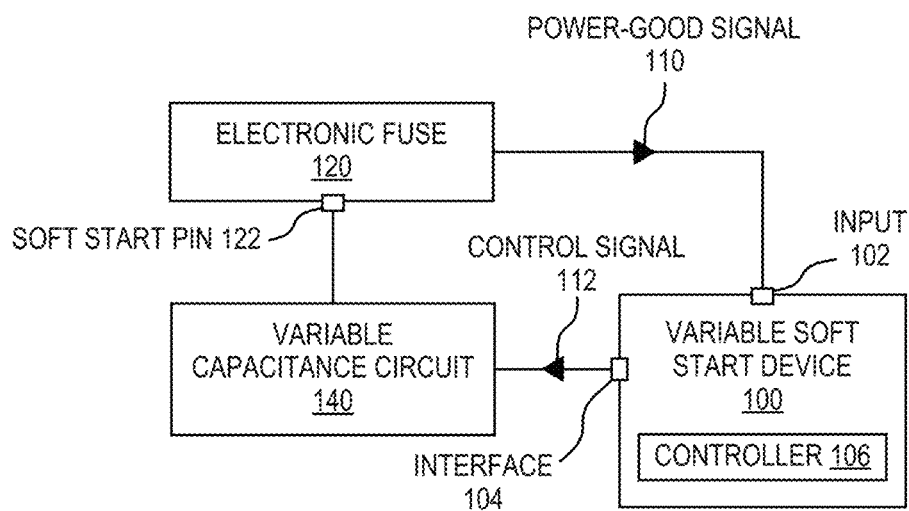
FIG. 1 is a block diagram that depicts an example variable soft start device, according to an implementation.

Throughout the drawings, identical reference numbers may designate similar, but not necessarily identical, elements. An index number "N" appended to some of the reference numerals may be understood to merely denote plurality and may not necessarily represent the same quantity for each reference numeral having such an index number "N". Use herein of a reference numeral without a hyphenated index number, where such reference numeral is referred to elsewhere with a hyphenated index number, may be a general reference to the corresponding plural elements, collectively or individually.

DETAILED DESCRIPTION

Some systems such as, for example, servers, desktop computers, workstations, and like computing systems, may be configured with various combinations of installable components. Examples of such components include expansion cards (e.g., PCI cards), storage devices (e.g., hard disk drives), memory, and others. Some systems may include an enclosure that can receive blade servers, in which case the blade servers may be considered to be the installable components.

To function, a component may draw electrical power (e.g., +3.3V, +5V, +12 V, etc.) from a power supply rail of a power supply of the system in which the component is installed. When voltage is initially supplied to the components via the power supply rail (e.g., when the system is powered on, when the component is hot plugged, etc.), an inrush current may flow over the power supply rail. The magnitude of the inrush current may depend on the electrical characteristics of the components, and in particular, the capacitances of the components. Because instantaneous current through a capacitive component is a function of the capacitance and the rate of voltage change over time (I=C*dV/dt), greater component capacitances may result in a greater current inrush. Various overcurrent devices, such as fuses and circuit breakers, may be employed to protect the components and the power supply from excessive inrush currents.

In particular, an electronic fuse (also referred to as an e-fuse) may be installed on the power supply rail and may provide a soft start, that is, a ramped voltage at the output of the electronic fuse, to limit the inrush current. The voltage rise time at the electronic fuse output (i.e., rate of the soft start) is often governed by an internal capacitance charge time of the electronic fuse. The voltage rise time can also be based on a ramp signal applied to a soft start pin of the electronic fuse (also referred to as a dV/dT pin), by connecting a capacitor to the soft start pin and driving a current (e.g., a substantially constant current) through the capacitor.

The electronic fuse also may include a power-good pin that outputs a signal to indicate whether the electronic fuse is outputting an expected or desired voltage. For example, for a power supply that is rated to provide +12V on a particular power supply rail, the power-good signal may normally be low (e.g., ~0V) if the power supply is not outputting +12V and may assert high (e.g., +5V) when the power supply is outputting +12V. The system or control circuitry thereof, such as on a motherboard, may wait until the power-good signal asserts high (e.g., +5V or other reference voltage) before activating components of the system. Alternatively or additionally, the power-good signal may also indicate whether protection circuitry of the electronic fuse has been tripped, such as when current inrush exceeds the power handling capabilities of the electronic fuse.

Different components may exhibit a wide range of capacitances. Additionally, a system may support a large number of component configurations (e.g., ranging from no installed components to a full complement of installed components). Thus, in some cases, the range of possible capacitance may vary by a factor of ten to twenty times, depending on the component configuration. An electronic fuse employed in a system to protect against overcurrent conditions caused by a large component capacitance may have very slow start up times, which may not appropriate if the system is instead configured in a manner that exhibits lower component capacitance. Moreover, some installable components may have low turn on voltages, which may add load to a very slow starting electronic fuse before the electronic fuse has finished turning on, thus increasing the energy dissipated in the electronic fuse and possibly preventing the electronic fuse from turning on, leading to component failure, and/or tripping component failure protection circuitry.

Example techniques of the present application may relate to, among other things, a variable soft start device that may connect to an electronic fuse and to a variable capacitance circuit. The variable capacitance circuit may be connected to a soft start pin of the electronic fuse. The variable soft start device may communicate control signals to the variable capacitance circuit, and the control signals can set a capacitance exhibited by the variable capacitance circuit to the soft start pin. The variable soft start device may receive a power-good signal from the electronic fuse and determine the capacitance to set by the control signal according to the received power-good signal. Accordingly, the systems and techniques of the present description may be useful for adjusting a capacitance at a soft start pin of an electronic fuse, which in turn adjusts a soft start behavior of the electronic fuse, so that the electronic fuse can safely and efficiently output good electrical power to a power supply rail, notwithstanding system-to-system variability in the electrical capacitances of loads on the power supply rail.

Referring now to the figures, FIG. 1 is a block diagram that depicts a variable soft start device 100 that may connect to an electronic fuse 120 and also may connect to a variable capacitance circuit 140. The variable capacitance circuit 140 may connect to the electronic fuse 120, and more particularly, the variable capacitance circuit 140 may be coupled to a soft start pin 122 of the electronic fuse 120. The electronic fuse 120 may be installed, together with a power supply, in a system (e.g., a server or other computing system). The variable soft start device 100 may be useful for controlling the soft start behavior of the electronic fuse 120, according to a manner described below.

The variable soft start device 100 includes an input 102, an interface 104, and a controller 106. In some implementations, the controller 106 is connected to both the input 102 and the interface 104, within the variable soft start device 100. The controller 106 may be a microcontroller, a microprocessor, central processing unit core(s), an application-specific integrated circuit (ASIC), a field programmable gate array (FPGA), a programmable logic device (PLD), a complex PLD, and/or other hardware device suitable for retrieval and/or execution of instructions stored on a machine readable medium (e.g., random access memory (RAM), read-only memory (ROM), electrically erasable programmable read-only memory (EEPROM), flash memory, a hard disk drive, etc.). The instructions, when executed, cause the controller 106 to perform the functionality described herein. Additionally or alternatively, the controller 106 may include one or more hardware devices, including electronic circuitry, for implementing functionality described herein.

The input 102 of the variable soft start device 100 may receive a power-good signal 110 from the electronic fuse 120. Some electronic fuses may output the power-good signal 110 continuously. In some implementations, the power-good signal 110 may indicate whether the electronic fuse 120 is outputting an expected power level (e.g., power that does not cause an overcurrent condition through the electronic fuse and/or +12 V, by virtue of being installed on the power supply rail of a power supply).

The interface 104 of the variable soft start device 100 may communicate with the variable capacitance circuit 140, which is coupled to the soft start pin 122 of the electronic fuse 120. The controller 106 may send a control signal 112 over the interface 104 to the variable capacitance circuit 140. The control signal 112 is to set the capacitance exhibited by the variable capacitance circuit 140 to the soft start pin 122. In turn, a soft start behavior of the electronic fuse 120 may be controlled by that capacitance of the variable capacitance circuit 140. Accordingly, the soft start may be deemed to be variable.

The controller 106 may determine the capacitance to which the variable capacitance circuit 140 is set (via the control signal 112), according to the power-good signal 110 received at the input 102. In some implementations, the controller 106 may determine the capacitance to set using the power-good signal 110 in a feedback loop.

For example, the controller 106 may send a control signal to set the capacitance of the variable capacitance circuit 140 to an initial value. The electronic fuse 120 may ramp up its output voltage (which is the so-called soft start) at a rate corresponding to the initial capacitance value of the variable capacitance circuit 140 at the soft start pin. In some implementations, the initial value may be a high capacitance value, and the controller will subsequently adjust the capacitance downwards as needed, according to a manner described below. In other implementations, the initial value may be a low capacitance value, and the controller 106 will adjust the capacitance of the variable capacitance circuit 140 upwards as needed. The soft start of the electronic fuse 120 will be slower for a high initial capacitance value of the variable capacitance circuit 140 than for a low initial capacitance value.

To determine the capacitance to set in response to the power-good signal 110, the controller reads the power-good signal 110 received at the input 102. If the power-good signal 110 indicates that the electronic fuse 120 is not outputting an expected power level (e.g., a low power-good signal), the controller 106 may either select the capacitance to set to be lower than a present capacitance exhibited by the variable capacitance circuit 140 to the soft start pin 122 if the initial value was a high value and the controller 106 may select the capacitance to set to be higher than the present capacitance if the initial value was a low value. On the other hand, if the power-good signal 110 indicates that the electronic fuse 120 is outputting an expected power level (e.g., a high power-good signal), the controller 106 may maintain the present capacitance (e.g., no control signal 112 is sent to change the capacitance of the variable capacitance circuit 140). In some implementations, the controller 106 may track the present capacitance of the variable capacitance circuit 140, in a memory register for example, each time the controller 106 sends a control signal to set the capacitance of the variable capacitance circuit 140.

In this manner, the electronic fuse 120 may be configured with a soft start that is suitable for the system in which the electronic fuse 120 is installed. In the case where the capacitance of the variable capacitance circuit 140 is initially set to a high value, the soft start may initially be too slow and decreasing the capacitance at the soft start pin will increase the soft start rate (i.e., faster voltage rise time) until the power-good signal 110 indicates that the electronic fuse is outputting the expected power level. In the case where the capacitance of the variable capacitance circuit 140 is initially set to a low value, the soft start may initially be over-aggressive (e.g., too fast) for some system configurations, which may allow large current inrush, thus causing the electronic fuse 120 to enter a protection mode and causing the power-good signal 110 to indicate that the electronic fuse 120 is not outputting the expected power level. In such a case, the controller 106 may increase the capacitance of the variable capacitance circuit 140 to decrease the soft start rate (i.e., slower voltage rise time) to limit the inrush current, until the electronic fuse 120 operates within specification and outputs the expected power level.

Figure 2:
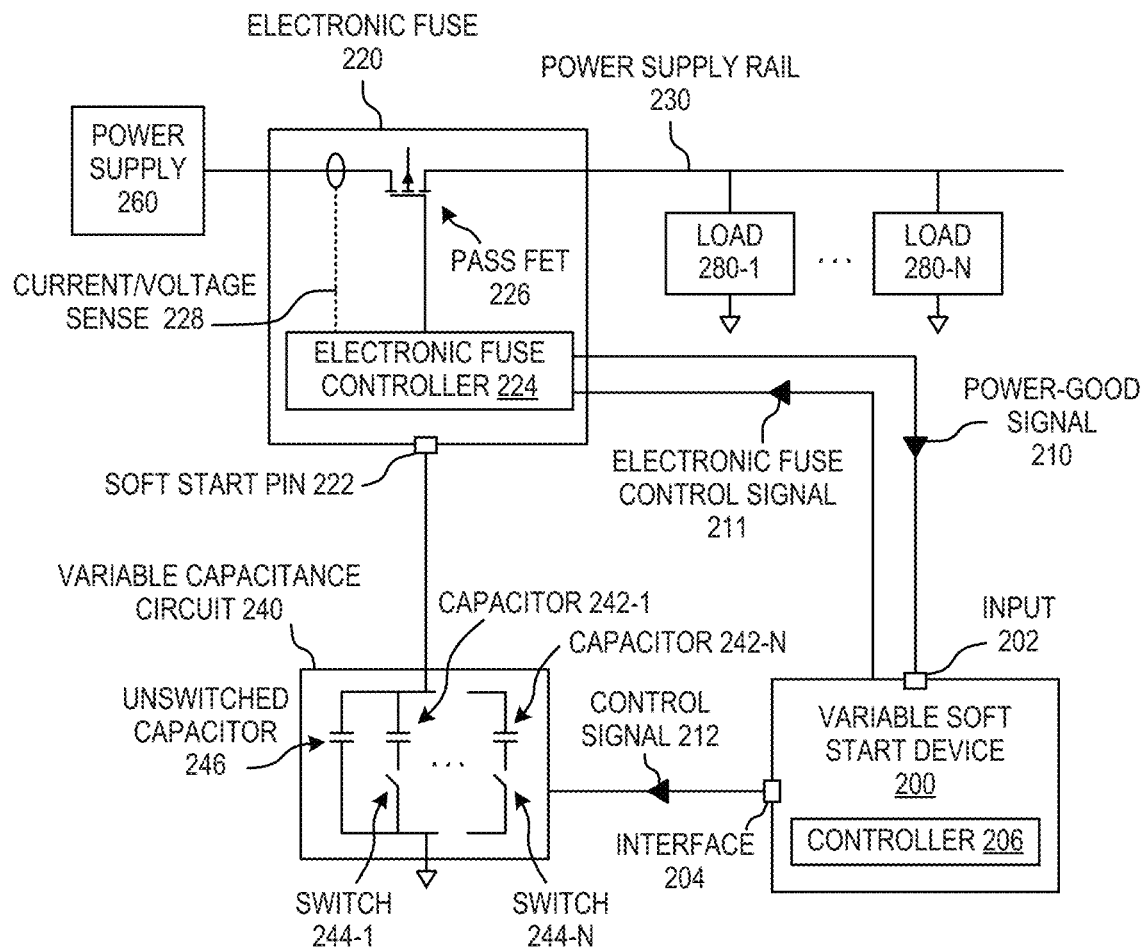
FIG. 2 is a block diagram that depicts an example variable soft start device, according to another implementation.

FIG. 2 is a block diagram that depicts an example variable soft start device 200, according to another implementation. The variable soft start device 200 includes an input 202, an interface 204, and a controller 206, each of which will be described further herein below. The variable soft start device 200 may connect, at least via the input 202, to an electronic fuse 220. The variable soft start device 200 also may connect, via the interface 204, to a variable capacitance circuit 240. The variable capacitance circuit 240 may connect to the electronic fuse 220, and more particularly, the variable capacitance circuit 240 may be coupled or connected to a soft start pin 222 of the electronic fuse 220. In some implementations, the variable capacitance circuit 240 is integrated with the variable soft start device 200, or in other words, the variable capacitance 240 and the variable soft start device 200 form an integrated unit. Prior to discussing the variable soft start device 200 in detail, the electronic fuse 220 and the variable capacitance 240 will first be described.

The electronic fuse 220 may be installed in series on a power supply rail 230 of a power supply 260. That is, voltage and current on the power supply rail 230 may depend on the output of the electronic fuse 220. The power supply 260 may convert mains AC electricity to regulated DC power on the power supply rail 230. In some implementations, the power supply 260 may provide +12 V on the power supply rail 230 (or other suitable voltages) to power components such as loads 280-1 through 280-N. For example, the loads 280 may include PCI cards, hard disk drives, and other components of a system (e.g., a server, a server enclosure, a desktop computer, a workstation, or other kinds of computing systems). Moreover, the loads 280 may be capacitive. The electronic fuse 220 may include an electronic fuse controller 224, which may include electronic circuitry and/or a microcontroller, microprocessor, ASIC, FPGA, etc., to perform various functions and logic of the electronic fuse 220 described below.

The electronic fuse 220 may provide overvoltage and overcurrent protection on the power supply rail 230, such as in the case of current inrush when a voltage from the power supply rail 230 is first applied to the loads 280. For example, the electronic fuse 220 may include a pass field effect transistor (FET) 226, which may be a MOSFET in particular, that acts as a switch on the power supply rail 230, and the gate-source voltage for turning on the pass FET 226 may be controlled to ramp up gradually by an electronic fuse controller 224. As the gate-source voltage is ramped up, the pass FET 226 transitions through its linear region until it is fully enhanced, and the drain-source resistance transitions from a high resistance (e.g., 10 Ohms) to a low resistance (e.g., 10 milliOhms). The gate-source voltage ramp provides for the electronic fuse soft start, because turning on the pass FET 226 in the foregoing manner allows the drain-source current of the pass FET 226, and thus the current along the power supply rail 230 and the voltage at the electronic fuse output, to rise over time.

The rate at which the gate-source voltage ramps up under the soft start feature and the voltage rise time at the electronic fuse output may be controlled by charging of a preset capacitance of the electronic fuse 220 (e.g., a capacitor within the electronic fuse controller 224). Alternatively, the electronic fuse 220 may include a soft start pin to which capacitance may be added to modify the ramp up rate. In some implementations, the soft start pin 222 may be routed directly to the gate of the pass FET 226, while in other implementations, the soft start pin 222 may be routed indirectly to the gate of the pass FET 226 (e.g., by way of a controller such as the controller 224, by way of an amplifier, or by way of other intermediary electronic components).

The electronic fuse 220 also may output a power-good signal 210 (generated by the electronic fuse controller 224), which may be analogous in many respects to the power-good signal 110 of FIG. 1. For example, the power-good signal 210 may indicate, by asserting high, that the electronic fuse 220 is outputting an expected power level. In particular, the power-good signal 210 may assert high when the pass FET 226 is full enhanced, which allows the electronic fuse 220 to output the expected power level on the power supply rail 230. On the other hand, the power-good signal 210 may remain low or revert to a low signal in other scenarios, including when the electronic fuse 220 is not outputting the expected power level or if the energy handling capability of the pass FET 226 has been exceeded (e.g., an overcurrent or overvoltage condition is sensed). In some implementations, the electronic fuse controller 224 may sense and monitor voltage and/or current (228) on the power supply rail to detect overvoltage and/or overcurrent conditions, and keep the power-good signal 210 low accordingly. Because the capacitances of the loads 280 may affect the inrush current on the power supply rail 230, the power-good signal 210 may reflect whether the electronic fuse soft start is configured appropriately for the loads 280. The foregoing electronic fuse conditions are represented by high and low power-good signal 210 logic states, but it should be understood that other representations can be utilized in other implementations.

The variable capacitance circuit 240 may include a plurality of capacitor-switch pairs in parallel, where each of the capacitor-switch pairs includes a capacitor and a switch in series. In the example of FIG. 2, a capacitor 242-1 and a switch 244-1 are arranged in series and form one such capacitor-switch pair. The pair of the capacitor 242-1 and the switch 244-1 may be in parallel with at least one other similar capacitor-switch pair (e.g., a capacitor 242-N arranged in series with a switch 244-N). In some examples, the switches 244 may be independently switchable MOSFETs, although other types of switch also may be employed. Additionally, in some implementations, the variable capacitor circuit 240 may include an unswitched capacitor 246 (that is, a capacitor not in series with a switch) in parallel with the plurality of capacitor-switch pairs.

Because the total capacitance of parallel capacitors is the summation of the capacitances, the total capacitance of the variable capacitance circuit 240 is at a maximum when all of the switches 244 of the capacitor-switch pairs are turned on (i.e., closed). On the other hand, when all of the switches 244 of the capacitor-switch pairs are turned off (i.e., open), the total capacitance of the variable capacitance circuit 240 is at a minimum (e.g., the capacitance of the unswitched capacitor 246). The capacitance of the variable capacitor circuit 240 is between the minimum and the maximum for different combinations of open and closed capacitor-switch pairs.

When the variable capacitance circuit 240 is coupled to the soft start pin 222, a current (e.g., a substantially constant current) provided by the soft start pin 222 upon enabling the electronic fuse will drive a voltage up at the soft start pin 222 as the capacitors of circuit 240 charge. This voltage increase will translate to an increase at the gate of the pass FET 226 to provide the electronic fuse soft start feature. The soft start feature may be modified to suit the characteristics of the loads 280 by the variable soft start device 200 controlling the capacitance of the variable capacitance circuit 240, as will now be described.

The variable soft start device 200 includes an input 202 and an interface 204. The input 202 and the interface 204 may be any type of terminal, contact, pin, port, etc. for electrical communication. For example, the input 202 may be to receive the power-good signal 210 from the electronic fuse 220. The interface 204 may be to communicate (e.g., transmit) a control signal 212 to the variable capacitance circuit 240. The controller 206 is connected to the input 202 and the interface 204. In this manner, the controller 206 can receive and process the power-good signal 210, and can generate the control signal 212 communicated via the interface 204. The controller 206 may be similar to the controller 106 in many respects, and may be any electronic circuitry and/or hardware device suitable for execution of instructions stored on a machine readable medium, to perform the functionality described herein.

In some implementations, the controller 206 may generate a control signal 212 to open or close individual switches of the capacitor-switch pairs of the variable capacitor circuit 240. For example, the control signal 212 may be to bias or turn on/off switches 244 individually (e.g., the interface 204 may be wired to the switches 244 individually, and the control signal 212 may include voltages applied to respective switch 244). In another example, the control signal 212 may be a data signal sent via a data-based interface 204 (e.g., RS-232, etc.) to the variable capacitance circuit 240, and a controller (not shown) of the variable capacitance circuit 240 may interpret the control signal 212 and bias or turn on/off switches 244 individually according to the control signal 212.

Because the variable capacitance circuit 240 may be connected to the soft start pin 222 of the electronic fuse 220 and affect biasing of the pass FET 226 as described above, the control signal 212 to set the capacitance of the variable capacitance circuit 240 may affect the voltage rise time of the power output of the electronic fuse 220 on the power supply rail 230. For example, the controller may set the voltage rise time to a fastest rate by sending a control signal 212 to open all of the switches 244 of the plurality of capacitor-switch pairs. Similarly, the controller may set the voltage rise time to a slowest rate by sending a control signal 212 to close all of the switches 244 of the plurality of capacitor-switch pairs.

Figure 3:
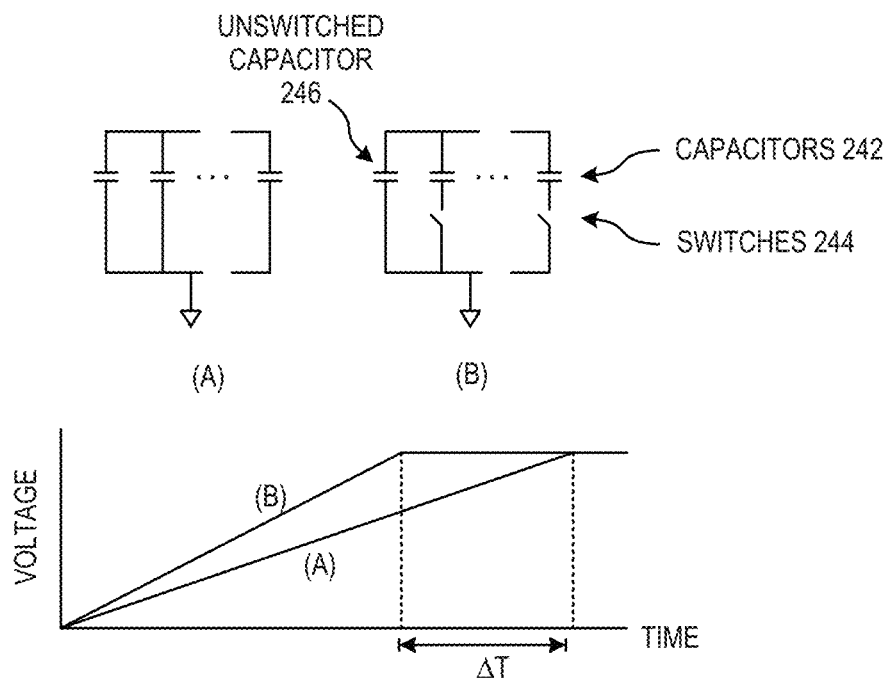
FIG. 3 is an illustration of example signals caused to be provided to by a variable soft start device, according to an implementation.

To illustrate the foregoing, FIG. 3 depicts signals provided to the soft start pin 222 by a variable soft start device, according to an implementation. A first scenario (A) depicts all of the switches 244 being closed and the variable capacitance circuit 240 exhibiting its maximum capacitance to the soft start pin 222, and a second scenario (B) depicts all of the switches 244 being open and the variable capacitance circuit 240 exhibiting its minimum capacitance to the soft start pin 222 (i.e., the capacitance of the unswitched capacitor 246). The graph of FIG. 3 illustrates the voltage rise observed at the soft start pin 222 (which may be connected to the gate of the pass FET 226) as the variable capacitance circuit 240 charges by a current from the soft start pin 222. The configuration of scenario (B) starts the electronic fuse 220 faster than the configuration of scenario (A) by delta-T.

Referring again to FIG. 2, the controller 206 may send a control signal 212 to set the capacitance of the variable capacitance circuit 240 to an initial value. The initial value may define the initial soft start behavior of the electronic fuse 220 upon application of the voltage of the power supply rail 230 to the loads 280. In some implementations, the initial value is a high initial value to provide a conservatively slow soft start behavior (i.e., slow voltage rise time). For example, the high initial value may be 100 nanofarads for a computing system with six PCI cards and sixteen hard disk drives for loads 280. In other implementations, the initial value is a low initial value (e.g., the capacitance of the unswitched capacitance or a low capacitance approaching zero nanofarads) to start with an aggressive soft start behavior, particularly if the loads 280 are known or expected to have low capacitances. The high initial value may be associated with closing all of the switches 244, and the low initial value may be associated with opening all of the switches 244.

After setting the initial value, the controller 206 may send an enable command to the electronic fuse 220 (more particularly, the electronic fuse controller 224) via an electronic fuse control signal 211. In some implementations, the electronic fuse control signal 211 may be carried over a different wire than the power-good signal 210. In response to the enable command, the electronic fuse 224 drives a current to the soft start pin 222, thus charging the variable capacitance circuit 240 connected thereto and ramping the voltage to the gate of the pass FET 226 to provide the electronic fuse soft start.

After the electronic fuse 220 is enabled and as the soft start is occurring, the controller 206 may read the power-good signal 210 from the input 202 and determine whether to change the capacitance of the variable capacitance circuit 240. For example, a power-good signal 210 that reads low may indicate that the electronic fuse 220 is not outputting the expected power level or that the energy handling capability of the pass FET 226 has been exceeded, as described above. If the power-good signal 210 reads low, the electronic fuse 220 may have automatically disabled by protection circuitry (e.g., by disconnect voltage to the gate of pass FET 226), or alternatively, the controller 206 may issue a disable command via the electronic fuse control signal 211.

In response to the power-good signal 210 reading low, the controller 206 may determine that the capacitance of the variable capacitance circuit 240 is to be changed. In particular, if the initial value of capacitance was a high initial value, the controller 206 determines the capacitance to set to be a capacitance achieved by opening a switch 244 of the plurality of capacitor-switch pairs, thus decreasing the total capacitance of the variable capacitance circuit 240, speeding up the bias voltage rise time for pass FET 226, and speeding up the voltage rise time at the electronic fuse output (i.e., voltage on power supply rail 230). If the initial value of capacitance was a low initial value, the controller 206 determines the capacitance to set to be a capacitance achieved by closing a switch 244 of the plurality of capacitor-switch pairs, thus increasing the total capacitance of the variable capacitance circuit 240, slowing the bias voltage rise time for pass FET 226, and slowing the voltage rise time at the electronic fuse output (i.e., voltage on power supply rail 230).

After changing the capacitance of the variable capacitance circuit 240, the controller 206 may again send an enable command to the electronic fuse controller 224 to initiate another soft start operation. The controller 206 may read the power-good signal 210 and change the capacitance again if the power-good signal 210 reads low. If the power-good signal 210 asserts high without reverting low, the controller 206 can maintain the capacitance of the variable capacitance circuit 240 (e.g., not make changes to the capacitance) and allow the soft start operation to finish.

Figure 4:
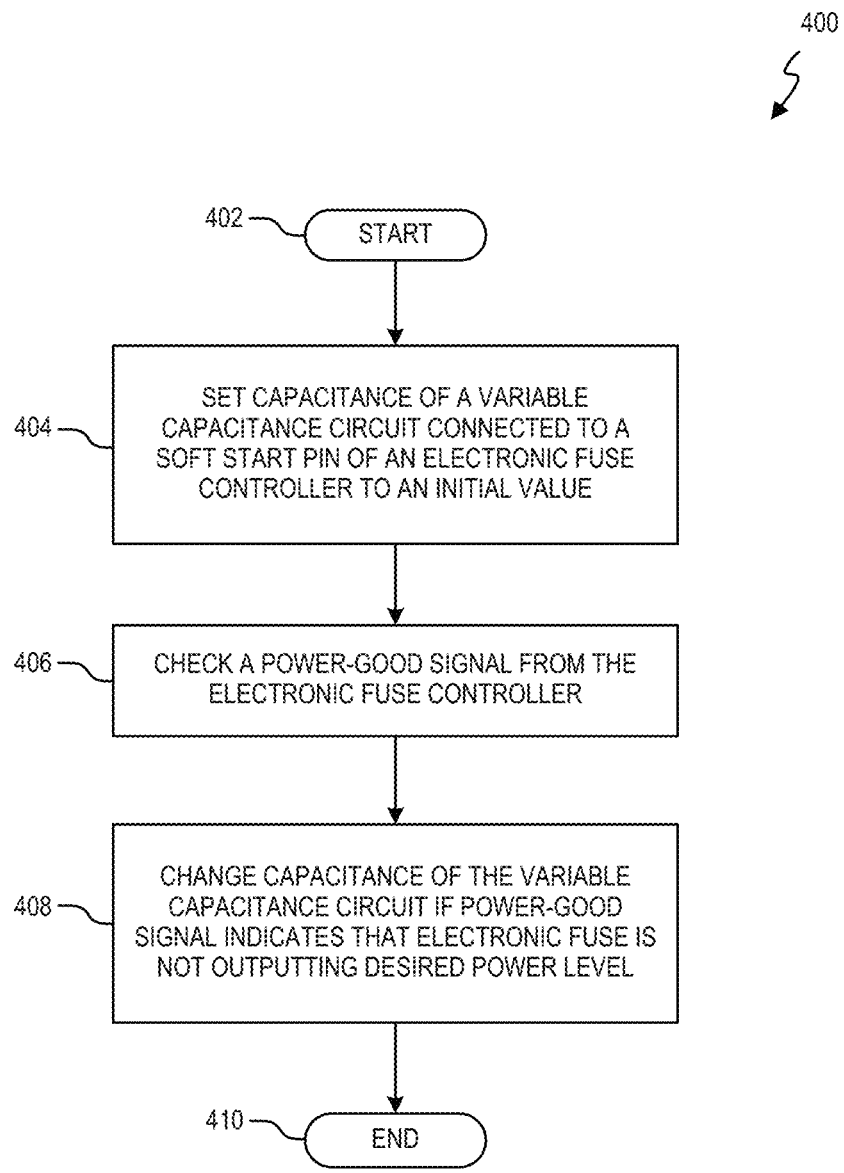
FIG. 4 is a flowchart of an example method that changes the capacitance at a soft start pin of an electronic fuse, according to an implementation.

FIG. 4 is a flowchart of an example method that changes the capacitance at a soft start pin of an electronic fuse, according to an implementation. Method 400 may be implemented in the form of executable instructions stored on a machine readable medium and executed by a processing resource (e.g., a microcontroller, a microprocessor, central processing unit core(s), an ASIC, a FPGA, etc.) and/or in the form of electronic circuitry. For example, method 400 below may be performed by the variable soft start device 100 of FIG. 1, and more particularly, by the controller 106. Various other variable soft start devices may be used as well, such as, for example, the variable soft start device 200. In some implementations of the present disclosure, one or more blocks of method 400 may be executed substantially concurrently or in a different order than shown in FIG. 4. In some implementations of the present disclosure, method 400 may include more or fewer blocks than are shown in FIG. 4.

The method 400 may begin at block 402, and continue to block 404, where a variable soft start device sets a capacitance of a variable capacitance circuit connected to a soft start pin of an electronic fuse to an initial value. At block 406, the variable soft start device checks a status of a power-good signal from the electronic fuse. At block 408, the variable soft start device, changes the capacitance of the variable capacitance circuit if the power-good signal indicates that the electronic fuse is not outputting a desired (expected) power level on a power supply rail. At block 410, the method 400 may end.

In some implementations, one or more of the blocks of method 400 may, at certain times, be ongoing and/or may repeat. For example, block 406 (and block 408) may be repeated by the soft start controller on a periodic basis to check for changes in the power-good signal.

Figure 5:
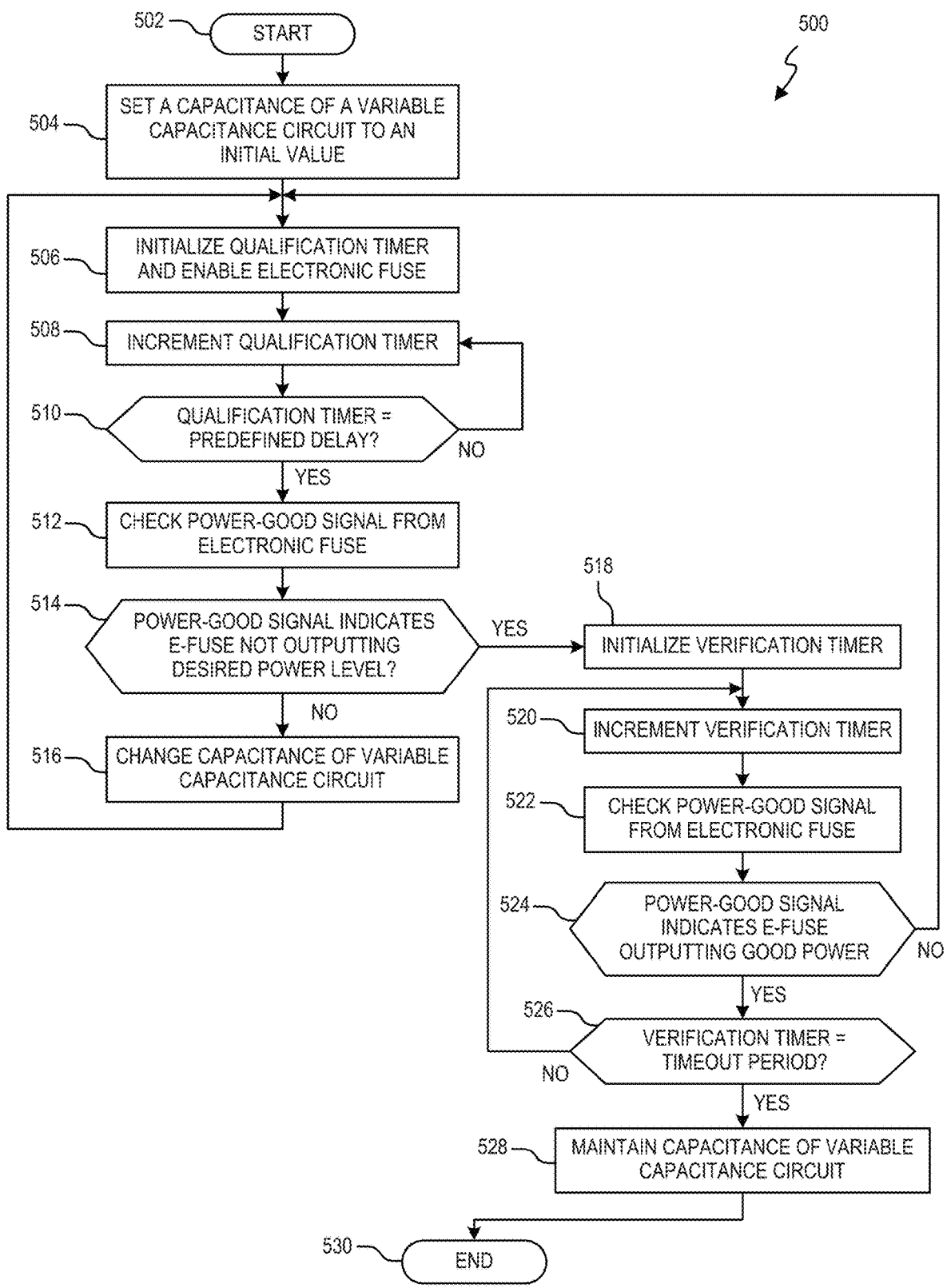
FIG. 5 is a flowchart of an example method that changes the capacitance at a soft start pin of an electronic fuse, according to another implementation.

FIG. 5 is a flowchart of an example method 500 that changes the capacitance at a soft start pin of an electronic fuse, according to another implementation. As with method 400, method 500 may be implemented in the form of executable instructions stored on a machine readable medium and executed by a processing resource and/or in the form of electronic circuitry. Method 500 may be performed, for example, by the variable soft start device 100 of FIG. 1, and more particularly, by the controller 106. Various other variable soft start devices may be used as well, such as, for example, the variable soft start device 200. In some implementations of the present disclosure, one or more blocks of method 500 may be executed substantially concurrently or in a different order than shown in FIG. 5. In some implementations of the present disclosure, method 500 may include more or fewer blocks than are shown in FIG. 5.

The method 500 may begin at block 502, and continue to block 504, where a variable soft start device sets a capacitance of a variable capacitance circuit connected to a soft start pin of an electronic fuse to an initial value. In some implementations, the variable capacitance circuit includes a plurality of capacitor-switch pairs arranged in parallel, each of the capacitor-switch pairs including a capacitor and a switch in series, and setting the capacitance of the variable capacitance circuit to the initial value at block 504 includes the variable soft start device sending a control signal to the variable capacitance circuit to close all or a majority of switches of the plurality of capacitor-switch pairs. In such an implementation, the initial capacitance of the variable capacitance circuit exhibited to the soft start pin is a high value (particularly, a maximum capacitance of the variable capacitance circuit if all switches are closed), which configures the electronic fuse to have a slow soft start.

At block 506, the variable soft start device initializes a qualification timer (e.g., initialized to zero) and enables the electronic fuse. At block 508, the variable soft start device increments the qualification timer (alternatively, a decrementing qualification timer may be employed). At block 510, the variable soft start device checks whether the qualification timer has reached a predefined delay. In some implementations, the predefined delay may be, for example, on the order of milliseconds. If the predefined delay has not been met by the qualification timer ("NO" at block 510), the qualification timer increments again at block 508. If the predefined delay has been met by the qualification timer ("YES" at block 510), the method proceeds to block 512.

At block 512, the variable soft start device checks a status of a power-good signal from the electronic fuse. At block 514, if the power-good signal indicates that the electronic fuse is not outputting a desired (expected) power level on a power supply rail ("NO" at block 514), the method 500 proceeds to block 516 where the variable soft start device may change the capacitance of the variable capacitance circuit. For example, if the initial capacitance of the variable capacitance circuit was set to a high value at block 504, changing the capacitance at block 516 may include sending a control signal to the variable capacitance circuit to open at least one switch of the plurality of capacitor-switch pairs, thus decreasing the capacitance of the variable capacitance circuit and accelerating the soft start of the electronic fuse. This process of checking the power-good signal and adjusting the capacitance may be referred to as a qualification process. After block 516, the method 500 restarts the qualification process and returns to block 506.

Returning to block 514, if the power-good signal indicates the electronic fuse is outputting good power on the power supply rail ("YES" at block 514), the variable soft start device may perform a verification process that includes verifying that the electronic fuse continues to output good power on the power supply rail during a timeout period (e.g., blocks 518 through 526), and if the electronic fuse outputs good power throughout the timeout period, maintaining the capacitance of the variable capacitance circuit for a remainder of a soft start of the electronic fuse (e.g., block 528).

For example, at block 518, the variable soft start device initializes a verification timer (which may be different from the qualification timer described above with respect to blocks 506, 508, 510) that counts up to a timeout period. In some example implementations, the timeout period may be one millisecond. The verification timer is incremented at block 520 (alternatively, a decrementing verification timer may be employed for counting down to zero from a timeout value).

Then, at block 522, the variable soft start device checks the power-good signal from the electronic fuse. In some implementations, block 522 may be interrupt driven, that is, the variable soft start device receives an interrupt signal from the electronic fuse if the power-good signal changes state (i.e., a state change to "not outputting good power"). In other implementations, the variable soft start device may poll or read the power-good signal of the electronic fuse at block 522.

If, at block 524, the power-good signal indicates that the electronic fuse is not outputting good power ("NO" at block 524), the method 500 returns to block 506 and requalifies the capacitance exhibited to the soft start pin of the electronic fuse (that is, perform blocks 506 through 514, and 516 as applicable, as described above).

If, at block 524, the power-good signal indicates that the electronic fuse is outputting good power ("YES" at block 524), the method proceeds to block 526, where the verification timer is compared to a timeout period. For example, if the variable soft start device 524 does not receive an interrupt signal from the electronic fuse indicating a power-good signal state change, the method proceeds to block 526. At block 526, if the verification timer has not met the timeout period ("NO" at block 526), then the method 500 returns to block 520 and the verification timer is again incremented. If the verification timer has met the timeout period ("YES" at block 526), then the method proceeds to block 528 where the capacitance of the variable capacitance circuit is maintained for the remainder of the electronic fuse soft start. The method 500 then ends at block 530.

Figure 6:
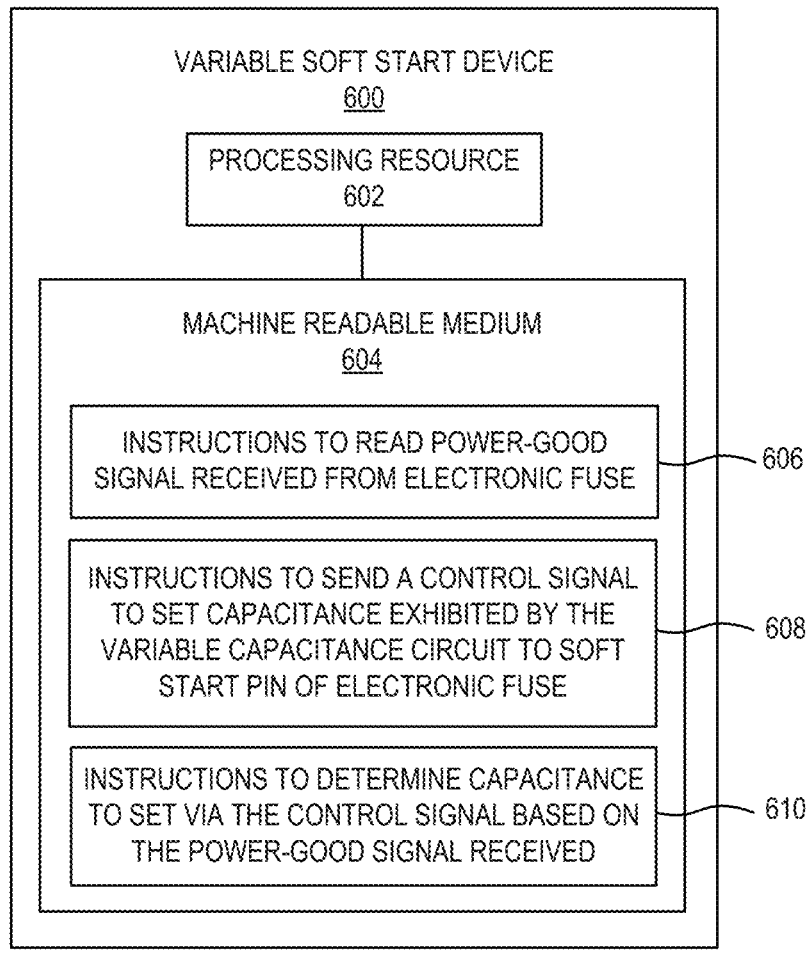
FIG. 6 is a block diagram of a variable soft start device that includes a non-transitory, machine readable medium encoded with example instructions to determine and set a capacitance exhibited to a soft start pin of an electronic fuse, according to an implementation.

FIG. 6 is a block diagram of a variable soft start device 600 that includes a non-transitory, machine readable medium encoded with example instructions to determine and set a capacitance exhibited to a soft start pin of an electronic fuse, according to an implementation. In some implementations, the networking device 600 may include at least one processing resource 602 coupled to the machine readable medium 604. In some implementations, the variable soft start device 600 may serve as or form part of the variable soft start device 100 of FIG. 1 or 200 of FIG. 2.

The processing resource 602 may include a microcontroller, a microprocessor, central processing unit core(s), an ASIC, an FPGA, and/or other hardware device suitable for retrieval and/or execution of instructions from the machine readable medium 604 to perform functions related to various examples. Additionally or alternatively, the processing resource 602 may include or be coupled to electronic circuitry or dedicated logic for performing some or all of the functionality of the instructions described herein.

The machine readable medium 604 may be any medium suitable for storing executable instructions, such as RAM, ROM, EEPROM, flash memory, a hard disk drive, an optical disc, or the like. In some example implementations, the machine readable medium 604 may be a tangible, non-transitory medium, where the term "non-transitory" does not encompass transitory propagating signals. The machine readable medium 604 may be disposed within the variable soft start device 600, as shown in FIG. 6, in which case the executable instructions may be deemed installed or embedded on the variable soft start device 600. Alternatively, the machine readable medium 604 may be a portable (e.g., external) storage medium, and may be part of an installation package.

As described further herein below, the machine readable medium 604 may be encoded with a set of executable instructions 606, 608, 610. It should be understood that part or all of the executable instructions and/or electronic circuits included within one box may, in alternate implementations, be included in a different box shown in the figures or in a different box not shown.

Instructions 606, when executed by the processing resource 602, may read a power-good signal received from an electronic fuse. Instructions 608, when executed by the processing resource 602, may send a control signal to a variable capacitance circuit that is coupled to a soft start pin of the electronic fuse. The control signal sets the capacitance exhibited by the variable capacitance circuit to the soft start pin, and a voltage rise time of a power output of the electronic fuse is proportional to the capacitance exhibited by the variable capacitance circuit to the soft start pin. Accordingly, the control signal sets the voltage rise time by way of setting the capacitance.

Instructions 610, when executed by the processing resource 602, may determine the capacitance to set via the control signal based on the power-good signal received. In some implementations, instructions 610 may determine the capacitance to set based on the power-good signal is a capacitance that is lower than a present capacitance exhibited by the variable capacitance circuit to the soft start pin, particularly if the power-good signal indicates that the electronic fuse is not outputting an expected power level. Additionally, the machine readable medium 604 may include instructions to maintain the present capacitance if the power-good signal indicates that the electronic fuse is outputting an expected power level.

In view of the foregoing description, it can be appreciated that the variable soft start device can monitor the behavior of an electronic fuse via the power-good signal and adjust the aggressiveness of the soft start of the electronic fuse based on the power-good signal. More particularly, the power-good signal may indicate the suitability of the soft start for the capacitive loads connected to the output of the electronic fuse, even if the capacitances of the loads are unknown, and the variable soft start device can adjust the electronic fuse soft start accordingly.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

What is claimed:

1. A variable soft start device comprising:
   an input to receive a power-good signal from an electronic fuse;
   an interface to communicate with a variable capacitance circuit that is coupled to a soft start pin of the electronic fuse; and
   a controller connected to the input and connected to the interface, the controller configured to:
      send a control signal over the interface to the variable capacitance circuit, the control signal to set a capacitance exhibited by the variable capacitance circuit to the soft start pin, and
      determine the capacitance to be set by the control signal according to the power-good signal received at the input,
   wherein a voltage rise time of a power output of the electronic fuse is proportional to the capacitance exhibited by the variable capacitance circuit to the soft start pin, and the control signal sets the voltage rise time by way of setting the capacitance.

2. The variable soft start device of claim 1, wherein
   the controller is configured to send an initializing control signal to set the capacitance to an initial value, and
   to determine the capacitance to be set, the controller is configured to:
      read the power-good signal received at the input from the electronic fuse,
      if the power-good signal indicates that the electronic fuse is not outputting an expected power level, select the capacitance to be set to lower than a present capacitance exhibited by the variable capacitance circuit to the soft start pin if the initial value is a maximum capacitance of the variable capacitance circuit and select the capacitance to be set to higher than the present capacitance if the initial value is a minimum capacitance of the variable capacitance circuit, and
      if the power-good signal indicates that the electronic fuse is outputting an expected power level, maintain the present capacitance.

3. The variable soft start device of claim 1, wherein the variable capacitance circuit is integrated with the variable soft start device.

4. The variable soft start device of claim 1, wherein
   the variable capacitance circuit includes a plurality of capacitor-switch pairs arranged in parallel, each of the capacitor-switch pairs including a capacitor and a switch in series, and
   the control signal sent by the controller is to open or close individual switches of the capacitor-switch pairs to set the capacitance exhibited by the variable capacitance circuit to the soft start pin.

5. The variable soft start device of claim 4, wherein the controller is configured to send an initializing control signal to set the capacitance to a high initial value, and in response to the power-good signal indicating that the electronic fuse is not outputting an expected power level, the controller determines the capacitance to be set to be a capacitance achieved by opening a switch of the plurality of capacitor-switch pairs.

6. The variable soft start device of claim 4, wherein the controller is configured to send an initializing control signal to set the capacitance to a low initial value, and
in response to the power-good signal indicating that the electronic fuse is not outputting an expected power level, the controller determines the capacitance to be set to be a capacitance achieved by closing a switch of the plurality of capacitor-switch pairs.

7. The variable soft start device of claim 4, wherein the variable capacitance circuit includes an unswitched capacitor in parallel with the plurality of capacitor-switch pairs, and
the controller is configured to set the voltage rise time on the power output of the electronic fuse to a fastest rate by sending the control signal over the interface to the variable capacitance circuit to open all of the switches of the plurality of capacitor-switch pairs.

8. The variable soft start device of claim 4, wherein the controller is configured to set the voltage rise time on the power output of the electronic fuse to a slowest rate by sending the control signal over the interface to the variable capacitance circuit to close all of the switches of the plurality of capacitor-switch pairs.

9. A method comprising:
setting, by a variable soft start device, a capacitance of a variable capacitance circuit connected to a soft start pin of an electronic fuse to an initial value by sending an initializing control signal to the variable capacitance circuit;
checking, by the variable soft start device, a status of a power-good signal from the electronic fuse; and
changing, by the variable soft start device, the capacitance of the variable capacitance circuit if the power-good signal indicates that the electronic fuse is not outputting a desired power level on a power supply rail by sending a control signal based on the power-good signal to the variable capacitance circuit,
wherein a voltage rise time of a power output of the electronic fuse is proportional to the capacitance of the variable capacitance circuit exhibited to the soft start pin, and the control signal sets the voltage rise time by way of setting the capacitance.

10. The method of claim 9, wherein the checking is repeated by the variable soft start device on a periodic basis.

11. The method of claim 9, further comprising:
in response to the power-good signal indicating that the electronic fuse is outputting good power on the power supply rail, verifying by the variable soft start device that the electronic fuse continues to output good power on the power supply rail during a timeout period; and
if the electronic fuse outputs good power throughout the timeout period, maintain the capacitance of the variable capacitance circuit for a remainder of a soft start of the electronic fuse.

12. The method of claim 9, wherein the variable capacitance circuit includes a plurality of capacitor-switch pairs arranged in parallel, each of the capacitor-switch pairs including a capacitor and a switch in series, and
the setting the capacitance of the variable capacitance circuit to the initial value includes sending the initializing control signal to the variable capacitance circuit to close all switches of the plurality of capacitor-switch pairs.

13. The method of claim 9, wherein the variable capacitance circuit includes a plurality of capacitor-switch pairs arranged in parallel, each of the capacitor-switch pairs including a capacitor and a switch in series, and
the changing the capacitance of the variable capacitance circuit includes sending the control signal to the variable capacitance circuit to open at least one switch of the plurality of capacitor-switch pairs.

14. The method of claim 9, wherein the variable capacitance circuit includes a plurality of capacitor-switch pairs arranged in parallel and each of the capacitor-switch pairs includes a capacitor and a switch in series,
the voltage rise time is a fastest rate when the control signal causes all switches of the plurality of capacitor-switch pairs to open, and
the voltage rise time is a slowest rate when the control signal causes all switches of the plurality of capacitor-switch pairs to close.

15. A non-transitory machine readable medium storing instructions executable by a controller of a variable soft start device, the non-transitory machine readable medium comprising:
instructions to read a power-good signal received from an electronic fuse;
instructions to send a control signal to a variable capacitance circuit that is coupled to a soft start pin of the electronic fuse, the control signal to set a capacitance exhibited by the variable capacitance circuit to the soft start pin; and
instructions to determine the capacitance to set via the control signal based on the power-good signal received,
wherein a voltage rise time of a power output of the electronic fuse is proportional to the capacitance exhibited by the variable capacitance circuit to the soft start pin, and the control signal sets the voltage rise time by way of setting the capacitance.

16. The non-transitory machine readable medium of claim 15, further comprising:
instructions to determine, in response to the power-good signal indicating that the electronic fuse is not outputting an expected power level, that the capacitance is to be set to bo lower than a present value of the capacitance exhibited by the variable capacitance circuit to the soft start pin if an initial value of the capacitance was a maximum capacitance of the variable capacitance circuit, and
instructions to maintain the present capacitance if the power-good signal indicates that the electronic fuse is outputting an expected power level.

17. The non-transitory machine readable medium of claim 15, further comprising:
instructions to determine the capacitance is to be set higher than a present value of the capacitance exhibited by the variable capacitance circuit to the soft start pin if an initial value of the capacitance was a minimum capacitance of the variable capacitance circuit in response to the power-good signal indicating that the electronic fuse is not outputting an expected power level; and
instructions to maintain the present capacitance if the power-good signal indicates that the electronic fuse is outputting an expected power level.

18. The non-transitory machine readable medium of claim 15, wherein the variable capacitance circuit includes a plurality of capacitor-switch pairs arranged in parallel, each of the capacitor-switch pairs including a capacitor and a switch in series, and the control signal opens or closes individual switches of the capacitor-switch pairs to set the capacitance exhibited by the variable capacitance circuit to the soft start pin.

19. The non-transitory machine readable medium of claim 18, wherein the variable capacitance circuit includes an unswitched capacitor in parallel with the plurality of capacitor-switch pairs, and the control signal for the determined capacitance sets the voltage rise time to a fastest rate by causing all of the switches of the plurality of capacitor-switch pairs to open.

20. The non-transitory machine readable medium of claim 18, wherein the control signal for the determined capacitance sets the voltage rise time to a slowest rate by causing all of the switches of the plurality of capacitor-switch pairs to close.

* * * * *